United States Patent
Ohya

[19]

[11] Patent Number: 5,298,775
[45] Date of Patent: Mar. 29, 1994

[54] SEMICONDUCTOR MEMORY DEVICE HAVING STACKED-TYPE CAPACITOR OF LARGE CAPACITANCE

[75] Inventor: Shuichi Ohya, Tokyo, Japan
[73] Assignee: NEC Corporation, Tokyo, Japan
[21] Appl. No.: 660,817
[22] Filed: Feb. 26, 1991
[30] Foreign Application Priority Data
Feb. 26, 1990 [JP] Japan .................................. 2-46153
[51] Int. Cl.$^5$ .............................................. G11C 11/24
[52] U.S. Cl. .................................... 257/211; 365/149; 257/296; 257/304; 257/311
[58] Field of Search ............... 365/149, 182, 63; 357/23.6, 45; 257/211, 311, 202, 296, 304, 305

[56] References Cited
U.S. PATENT DOCUMENTS
4,651,183  3/1987  Lange et al. ................... 357/23.6
5,012,309  4/1991  Nakayama .................... 357/23.6

Primary Examiner—William Mintel
Assistant Examiner—Roy Potter
Attorney, Agent, or Firm—Sughrue, Mion, Zinn, Macpeak & Seas

[57] ABSTRACT

A DRAM comprising word lines parallel to an X-axis and bit lines parallel to a Y-axis wherein the memory cell consists of a transistor and a stacked-type charge-storage capacitor is disclosed. The storage node electrode of the stacked-type charge-storage capacitor is formed to project on the surface of the silicon substrate a rectangle of which the major sides are oblique to the X-axis and Y-axis or a pattern consisting of at least two different rectangles. Thereby the perimeter of the storage node electrode becomes more than that in the prior art. This enables the realization of charge-storage capacitors having larger capacitance value than in a conventional DRAM under the same manufacturing conditions. This effect is marked under the conditions where the film thickness of the storage node electrode is more than ½ of the minimum feature size, and the distance between two adjacent storage node electrodes is equal to the minimum feature size.

20 Claims, 13 Drawing Sheets

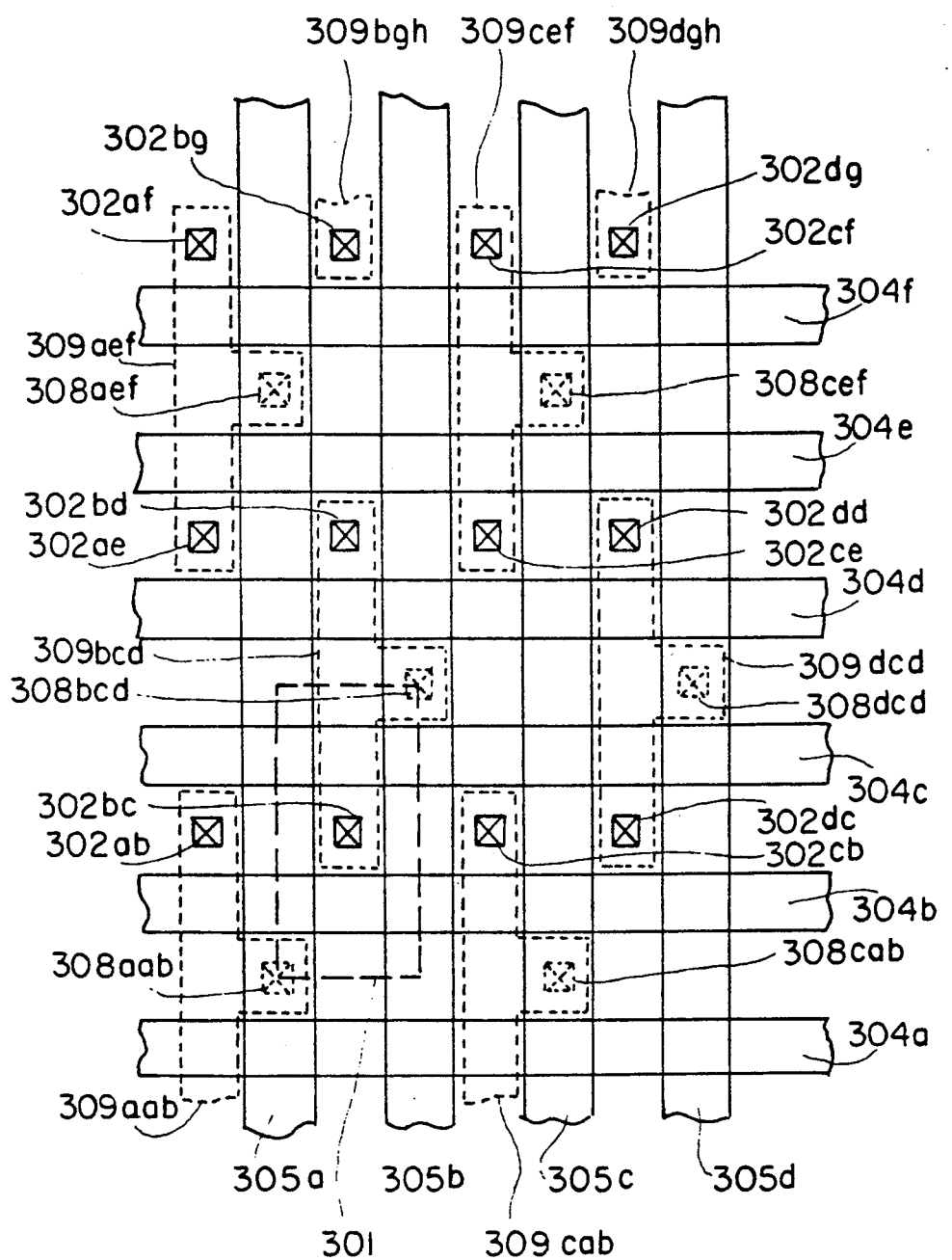

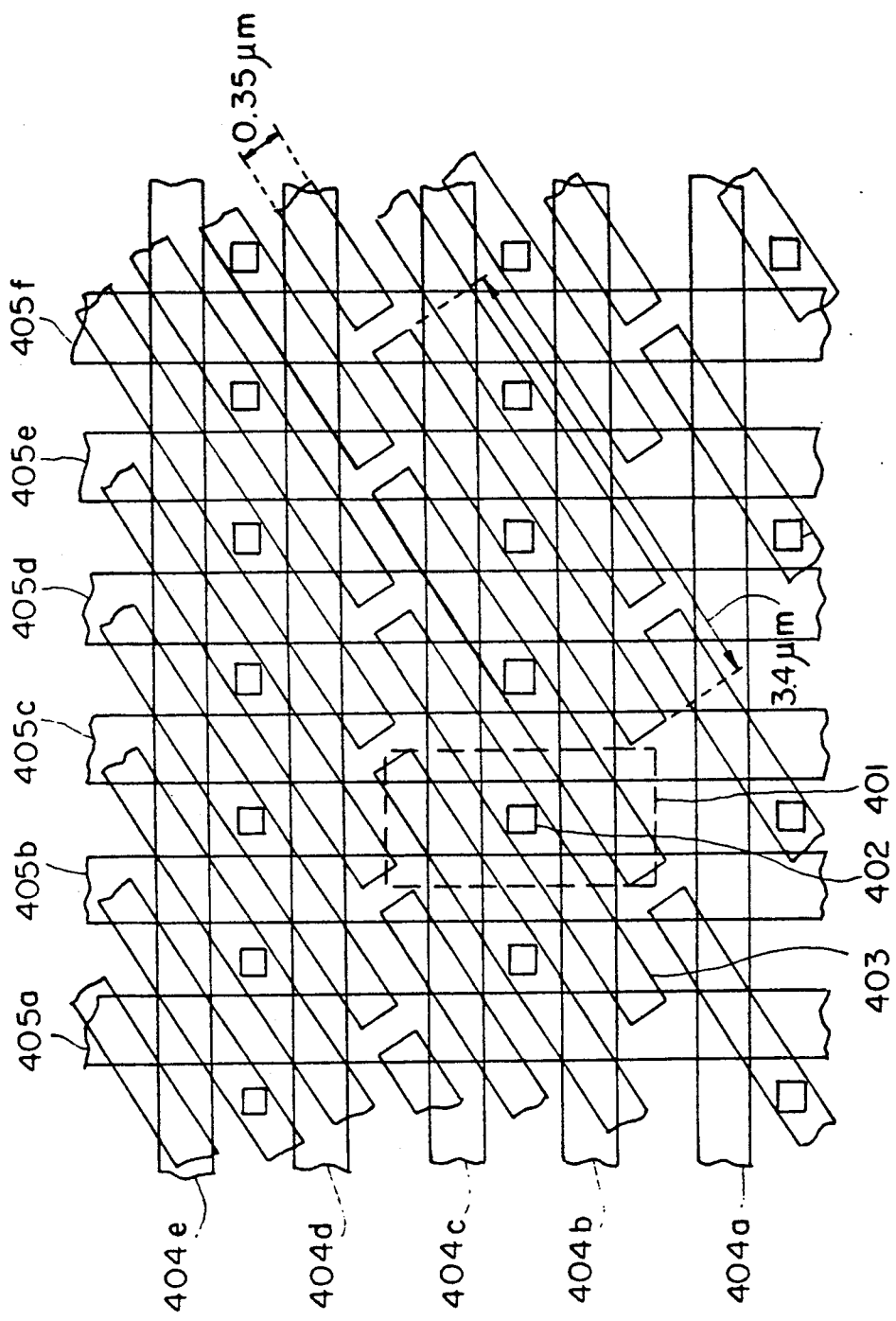

SEMICONDUCTOR MEMORY DEVICE HAVING STACKED-TYPE CAPACITOR OF LARGE CAPACITANCE

BACKGROUND OF THE INVENTION

1. Field of the Invention

This invention relates to a semiconductor memory device, and more particularly to the shape and arrangement of storage node electrodes of the charge-storage capacitors in a DRAM comprising memory cells each consisting of a transistor and a stacked-type charge-storage capacitor.

2. Description of the Prior Art

DRAM stores information as an electric charge in charge-storage capacitors. From the viewpoint of stable operation and the memory retention time, it is desired to make the capacitance of the charge-storage capacitor as large as possible. On the other hand, it is needed for higher integration of DRAM to miniaturize the memory cell, accompanied by to smaller allowable projective plane area for the charge-storage capacitor. The projective plane area is smaller than the size of the memory cell. For solving this contradiction, in the DRAM comprising memory cells each consisting a transistor and a charge-storage capacitor, as the structure of the charge-storage capacitor became used firstly planar type, followed by trench type, and then stacked type. With deeper trench, the trench-type charge-storage capacitor can have larger side-face area accompanied by increasing capacitance. The stacked-type charge-storage capacitor can have larger capacitance due to the storage node electrode essentially higher or thicker, and hence having larger side face area. The newest stacked-type charge-storage capacitor is intended to have further increased capacitance by the use of fin-structured storage node electrode. (Fin-structure has been impossible to be applied to trench type.) Unless specified structure such as fin-structure is taken into consideration, the capacitance of the charge-storage capacitor depends only on the surfaces of the top and side faces of the storage node electrode.

Of recent stacked-type DRAMs, the most compact one is exemplified in IDEM Technical Digest pp. 596-599, 1988.

On the surface of a p-type substrate, word lines parallel to the X-axis and bit lines parallel to the Y-axis orthogonal with the X-axis are formed as a matrix arrangement. The size of the memory cell in the DRAM is $2P_W \times P_B$, $P_W$ being the pitch of the word lines (the word line width plus the distance between the word lines) and $P_B$ being the pitch of the bit lines (the bit line width plus the distance between the bit lines). An active area is formed of, for example, an area defined by the ith and i+1th bit lines and the jth and j+1th word lines, for example, an area defined by the i+1th and i+2th bit lines and the j+2th and j+3th word lines, and an area connecting between these areas. This active area includes a $n^+$-type self-aligned diffusion regions. The $n^+$-type diffusion region defined by the ith and i+1th bit lines and the jth and j+1th word lines serves as node diffusion region for (i+1, J+1) bit. The $n^+$-type diffusion region between j+1th and j+2 word lines serves as bit diffusion region for (i+1, J+1) bit and (i+1, j+2) bit. The $n^+$-type diffusion region defined by i+1th and i+2the bit lines and j+2th and j+3th word lines serves as node diffusion region for (i+1, j+2) bit. The j+1th word line, the node diffusion region for (i+1, J+1) bit, and the bit diffusion region for (i+1, J+1) bit and (i+1, J+1) bit constitute a transistor for (i+1, j+1) bit. Similarly the j+2th word line, the node diffusion region for (i+1, J+2) bit, and the bit diffusion region for (i+1, J+1) bit and (i+1, J+2) bit constitute a transistor for (i+1, j+2) bit.

The bit diffusion region for (i+1, J+1) bit and (i+1, J+2) bit is provided with a bit contact hole connecting to i+1th bit line. The node diffusion region for (i+1, j+1) bit is provided with a storage node contact hole connecting to the storage node electrode for a charge-storage capacitor of (i+1, j+1) bit. The node diffusion region for (i+1, j+2) bit is provided with a storage node contact hole connecting to the storage node electrode for a charge-storage capacitor of (i+1, j+2) bit. The top faces of the storage node electrodes of these charge storage capacitors project generally rectangles on the surface of the silicon substrate. Of the rectangle, the major sides are parallel to bit lines or Y-axis and the minor sides to word lines or X-axis.

In such a stacked-type DRAM, the capacitance of a charge-storage capacitor is created by a storage node electrode, a cell plate electrode and a capacitive dielectric film between these electrodes. The capacitance value of the charge-storage capacitor depends on the dielectric constant and the thickness of the capacitive insulating film, and the electrode area which is the area of the opposed surfaces of the storage node electrode and the cell plate electrode. Assuming capacitive insulating film is of a certain kind and has a fixed thickness, then only increase of the electrode area is responsible for increase in the capacitance value of this capacitor. The electrode area is equal to the surface area of the storage node electrode.

Of the storage node electrode, the surface area $A_{T0}$ is the sum of the area $A_{t0}$ of the top face and the area $A_{s0}$ of the side face. Strictly speaking, the top face is a curved surface which projects an area smaller than the cell size $2P_W \times P_B$ on the surface of the silicon substrate. Using minimum feature size for fabricating this DRAM, F, as the distance between two storage node electrodes gives the maximum value of $A_{T0}$. Under this condition, the top face projects a rectangle of which the major sides are parallel to bit lines on the silicon substrate surface. The rectangle has an area of $(2P_W - F) \times (P_B - F)$ and a perimeter, $L_{F0}$, of $2 \times (2P_W + P_B - 2F)$. Assuming d in the film thickness or height of the storage node electrode, the area of the size face, $A_{s0}$, is given as $2 \times (2P_W + P_B - 2F) \times d$.

The conventional method for increasing the surface area of the storage node electrode, $A_{T0}$, is generally to reduce F, especially to increase d. Further increase of it can be achieved by forming irregularities on the top and side faces. Such methods for increasing the storage node electrode surface area, $A_{T0}$, however, involve process of fabrication, and thus the increase of $A_{T0}$ is limited by the manufacture techniques of the times so far as the shape and arrangement of storage node electrodes in the prior art are used. In other wores, it is impossible to increase the perimeter and also the surface area $A_{T0}$ of the storage node electrode independent of manufacture techniques.

BRIEF SUMMARY OF THE INVENTION

Objects of the Invention

It is an object of the invention to profide a DRAM comprising memory cells each consisting of a transistor and a charge-storage capacitor.

Another object of the invention is to provide a DRAM comprising memory cells each consisting of a transistor and a stacked-type charge-storage capacitor.

A further object of the invention is to provide a DRAM comprising highly-packed memory cells.

A further object of the invention is to provide a DRAM comprising highly-packed memory cells wherein each charge-storage capacitor has a high capacitance value.

A further object of the invention is to provide a DRAM wherein each charge-storage capacitor includes a storage node electrode having a large surface area.

A further object of the invention is to profide a DRAM wherein the side face of each storage node electrode has a larger surface area.

A further object of the invention is to provide a DRAM wherein each storage node electrode has a longer perimeter.

Summary of the Invention

The first construction of semiconductor memory device according to the invention is that in a DRAM in which the memory cell consists of a transistor and a charge-storage capacitor formed on the surface of a silicon substrate and which comprises word lines parallel to X-axis and bit lines parallel to Y-axis orthogonal to X-axis, the storage node electrode of the charge-storage capacitor has a film thickness (height) more than ½ of the minimum feature size (laterally) termed in lighography, and projects on the surface of the silicon substrate a rectangle of which the major sides are not parallel to X-axis and Y-axis.

The major sides of the pattern projected on the substrate are preferably parallel to one or the other of the diagonals of the rectangle formed on the ith and i+1th bit lines and jth and j+2th word lines, the major sides of the pattern projected on the substrate are preferably parallel to one or the other of the diagonals of the rectangle formed of the ith and i+1th bit lines and jth and j+4th word lines, the major sides of the pattern projected on the substrate are preferably parallel to one or the other of the diagonals of the rectangle formed of the ith and i+2th bit lines and jth and j+2th word lines, the major sides of the pattern projected on the substrate are preferably parallel to one or the other of the diagonals of the rectangle formed of the ith and i+3th bit lines and jth and j+2th word lines, or the major sides of the pattern projected on the substrate are preferably parallel to one or the other of the diagonals of the rectangle formed of the ith and 1+3th bit lines and jth and j+4th word lines.

In the first construction of semiconductor memory device according to the present invention, the rectangle of the storage node electrode projected on the surface of the silicon substrate is more in major side than that in the prior art. Besides if the film thickness of the storage node electrode of the charge-storage capacitor is more than ½ of the minimum feature size, then increase in the side face area of the storage node electrode is more than decrease in the top face area of it. The surface area of the storage node electrode therefore is larger than that in the prior art. This enables the realization of such charge-storage capacitor having a larger capacitance value than that in the prior art without needing any new processing step.

The second construction of semiconductor memory device according to the invention is that in a DRAM in which the memory cell consists of a transistor and a charge-storage capacitor formed on the surface of a silicon substrate and which comprises word lines parallel to X-axis and bit lines parallel to Y-axis orthogonal to X-axis, the storage node electrode of the charge-storage capacitor has a film thickness (height) more than ½ of the minimum feature size (laterally) termed in lithography, and projects on the surface of the silicon substrate a pattern consisting of at least two rectangles parallel to X-axis and Y-axis.

In the second construction of semiconductor memory device according to the present invention, the perimeter of the storage node electrode has a perimeter more than that in the prior art. Besides if the film thickness of the storage node electrode of the charge-storage capacitor is more than ½ of the minimum feature size, then increase in the side face area of the storage node electrode is more than decrease in the top face area of it. The surface area of the storage node electrode therefore is larger than that in the prior art. This enables the realization of such charge-storage capacitor having a large capacitance value than that in the prior art without needing any new processing step.

BRIEF DESCRIPTION OF THE DRAWINGS

The above-mentioned and other objects, features and advantage of this invention will become more apparent by reference to the following detailed description of the invention taken in conjunction with the accompanying drawings, wherein:

FIG. 1A is a plan view in schematic illustration and FIG. 1B is a cross-sectional view in schematic illustration taken along folded line A-B of FIG. 1A;

FIGS. 8A and 8B are plan views in schematic illustration of the second embodiment of the present invention;

FIG. 9 is plan views in schematic illustration of the third embodiment of the present invention;

DETAILED DESCRIPTION OF THE PREFERRED EMBODIMENTS

First the course where the present invention has been accomplished, and subsequently embodiments of the present invention will be set forth.

One of the most highly-packed memory cell arrangement was reported in IEDM Technical Digest pp. 596–599, 1989, as earlier described, in which dimensions, shapes and arrangements about transistors, active areas, bit lines, word lines, bit contact holes, and storage node contact holes were disclosed, leaving those of storage node electrodes which are a component of the respective stacked-type charge-storage capacitors to be unstated.

Figure 1A:
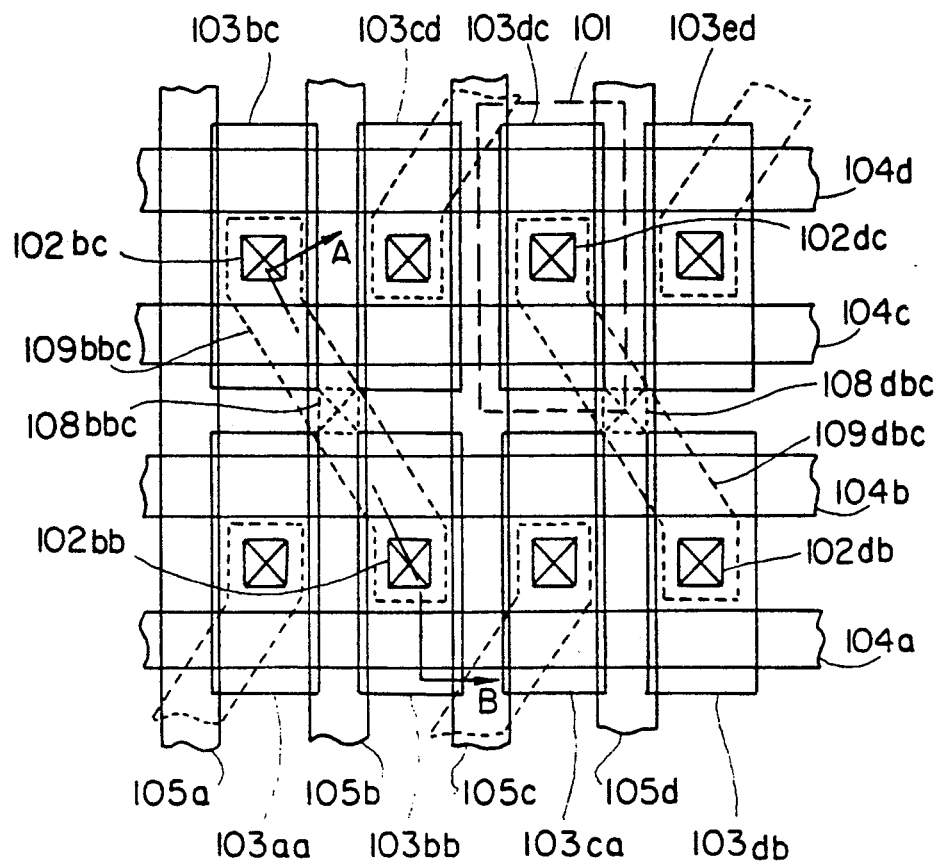
FIGS. 1A and 1B gives illustration of the concept of the present invention based on a conventional semiconductor memory device, and in particular
Figure 1B:
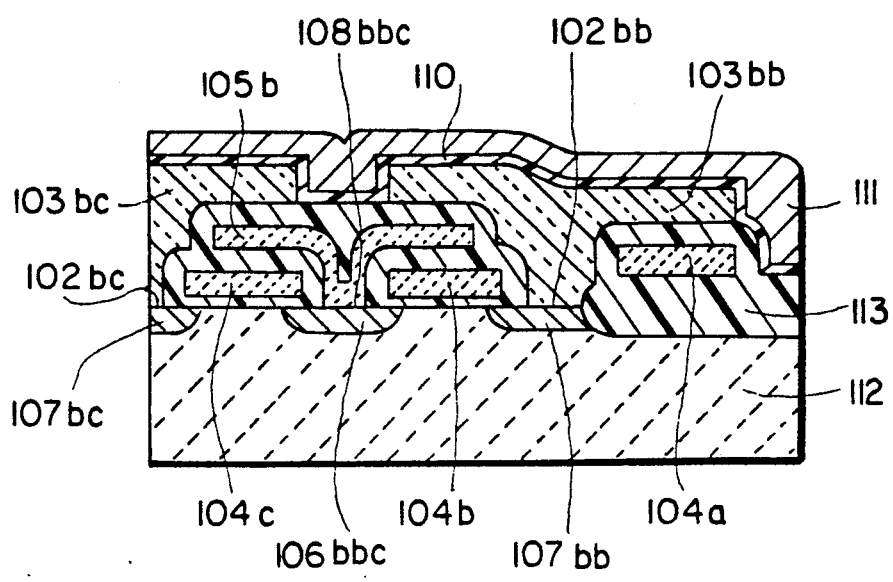

FIGS. 1A and 1B illustrates the DRAM described in the above-mentioned report by using dimensions, shape, and arrangement of storage node electrodes therein inferred by the inventor for maximizing the size of the storage node electrodes. FIG. 1A is a plan view in schematic illustration and FIG. 1B is a sectional view in schematic illustration taken along folded line A-B of FIG. 1A.

On the surface of a p-type silicon substrate 112, a matrix arrangement are formed which consists of word lines 104a, 104b, 104c, 104d parallel to X-axis and bit lines 105a, 105b, 105c and 105d parallel to Y-axis orthogonal with X-axis. In the DRAM, the area one cell takes up is exhibited as by a memory cell 101 of which the cell size is the product of twice the pitch of word lines (the word line width plus the distance between word lines), Pw, and the pitch of bit lines (the bit line width plus the distance between bit lines), $P_B$, and thus $2Pw \times P_B$. For clarity of below description, assuming $Pw = P_B = P$, the cell size in the DRAM becomes $2P^2$.

The p-type silicon substrate 112 is provided on the surface thereof with active areas, and thin insulating film 113 formed on the active areas and thick insulating film 113 on the rest. The surfaces of the word lines and bit lines are covered with insulating film 113.

For example, an active area 109bbc is constructed of an area defined by bit lines 105a, 105b and word lines 104c, 104d, an area defined by bit lines 105b, 105c and word lines 104a, 104b, and the area connecting these areas. In active area 109bbc, there is provided a n+-type self-aligned diffusion region. The n+-type diffusion region defined by bit lines 105a, 105b and word lines 104c, 104d serves as a node diffusion region 107bc for (b, c). The n+-type diffusion region in active area 109bbc between word lines 104b, 104c serves as a bit diffusion region 106bbc for (b, b) bit and (b, c) bit. The n+-type diffusion region defined by bit lines 105b, 105c and word lines 104a, 104b serves as a node diffusion region 107bb for (b, b) bit.

Node diffusion region 107bc, bit diffusion region 106bbc and word line 104c constitute a transistor for (b, c) bit. Similarly the node diffusion region 107bb, bit diffusion region 106bbc and word line 104b constitute a transistor for (b, b) bit. In active area 109dbc, as in active area 109bbc, the diffusion region serving as components of transistor for (d, c) bit and transistor for (d, b) bit are found.

Bit diffusion region 106bbc is provided with a bit contact hole 108bbc connecting to bit line 105b. Similarly bit diffusion region 109dbc is provided with a bit contact hole 108dbc connecting to bit line 105d. Node diffusion regions 107bc, 107bb are provided with the respective storage node contact holes 102bc or 102bb connecting to storage node electrodes 103bc, 103bb of charge-storage capacitors for (b, c) bit, (b, b) bit. Likewise in active area 109dbc, each node diffusion region is provided with a storage node contact hole 102db or 102bc connecting to the corresponding storage node electrode 103db or 103dc of charge-storage capacitor for (d, b) bit or (d, c) bit. Storage nodes electrodes 103aa103ca, 103cd, 103ed connect through the respective storage node contact holes to the respective node diffusion regions.

The above-mentioned report does not disclose the shape of the storage node electrode. Description will be proceeded under the assumption based on the conventional DRAM that it has the shape as shown: the top face of the storage node electrode, which is a component of these charge-storage capacitors, projects on the surface of the silicon substrate a rectangle of which the major sides parallel to bit lines (Y-axis) and the minor sides parallel to wrod lines (X-axis).

The capacitance of the charge-storage capacitor in a stacked-type DRAM is constructed of a storage node electrode, a cell plate electrode 111, and capacitive insulating film 110 between them. The capacitance value of this charge-storage capacitor is obtained with the dielectric constant and thickness of the capacitive insulating film 110 and the opposed surfaces of the two electrodes. Assuming a specified capacitive dielectric film and a fixed thickness thereof, then only increase of the opposite area is responsible for increase in the capacitance value of this capacitor. Besides the opposite area is equal to the surface area of the storage node electrode.

Of the storage node electrode, the surface area $A_{T0}$ is the sum of the area $A_{t0}$ of the top face and the area $A_{s0}$ of the side face. The top face is a curved surface strictly, and projects an area smaller than the cell size $2P^2$ on the surface of the silicon substrate. Using minimum feature size for fabricating this DRAM as the distance between two storage node electrode gives the maximum value of $A_{T0}$. Under this condition, the top face projects a rectangle of which the major sides are parallel to bit lines on the silicon substrate surface. The rectangle has an area of $(2P-F) \times (P-F)$ and a perimeter, $L_{F0}$, of $2 \times (3P-2F)$. Assuming d in the film thickness or height of the storage node electrode, the area of side face, $A_{s0}$, is given as $2 \times (3P-2F) \times d$.

The conventional method for increasing the surface area of the storage node electrode, $A_{T0}$, is generally to reduce F, especially to increase d. Further increase of it can be achieved by forming irregularities on the top and side faces. Such methods for increasing the storage node electrode surface area, $A_{T0}$, however, involve process of fabrication, and thus the increase of $A_{T0}$ is limited by the manufacture techniques of the times so far as the shape and arrangement of storage node electrodes in the prior art are used. In other words, it is impossible to increase the perimeter and also the surface area $A_{T0}$ of the storage node electrode independent of the manufacture techniques.

Figure 2:
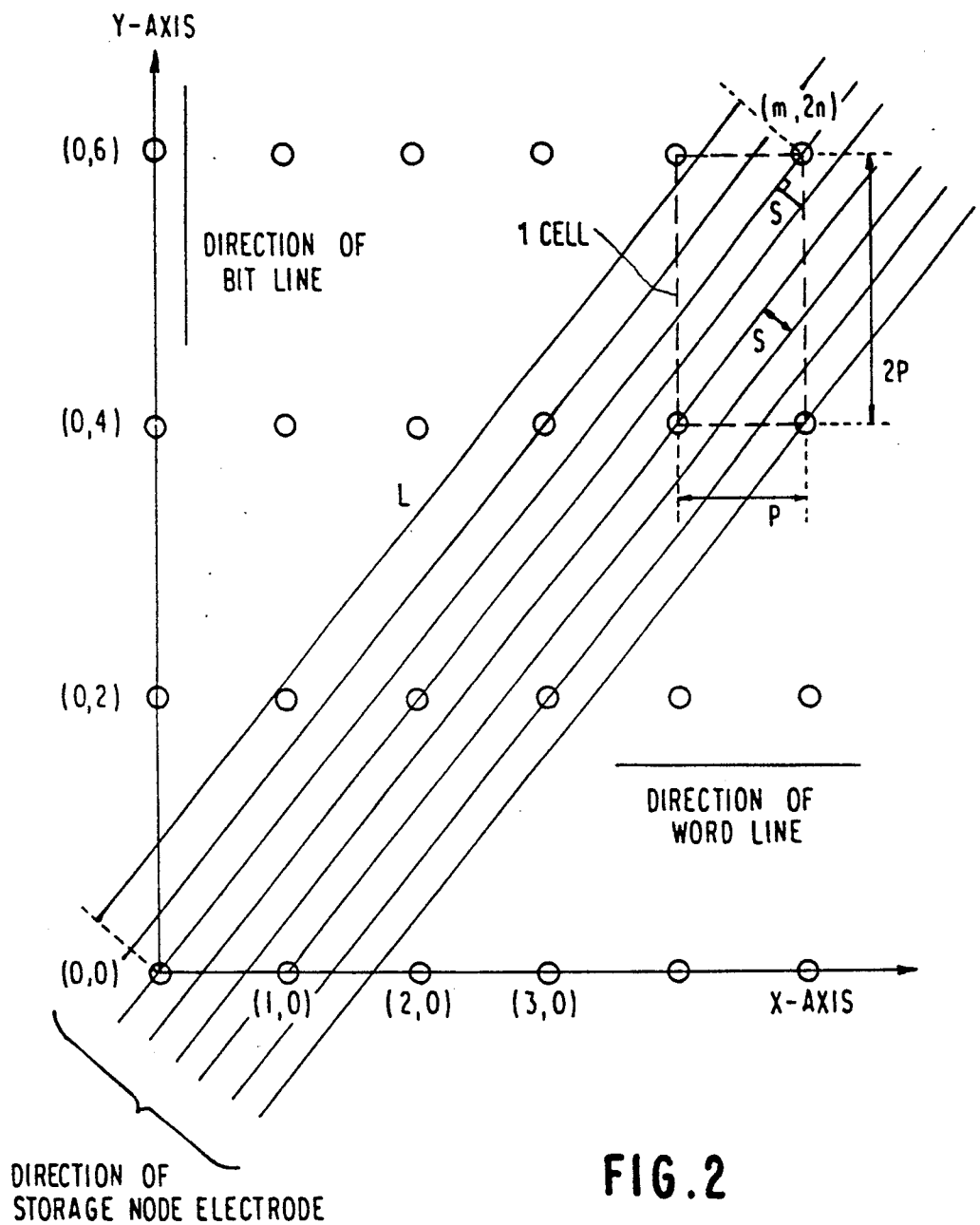
FIG. 2 is an illustration of the first construction of semiconductor memory device embodying the present invention.
Figure 3:
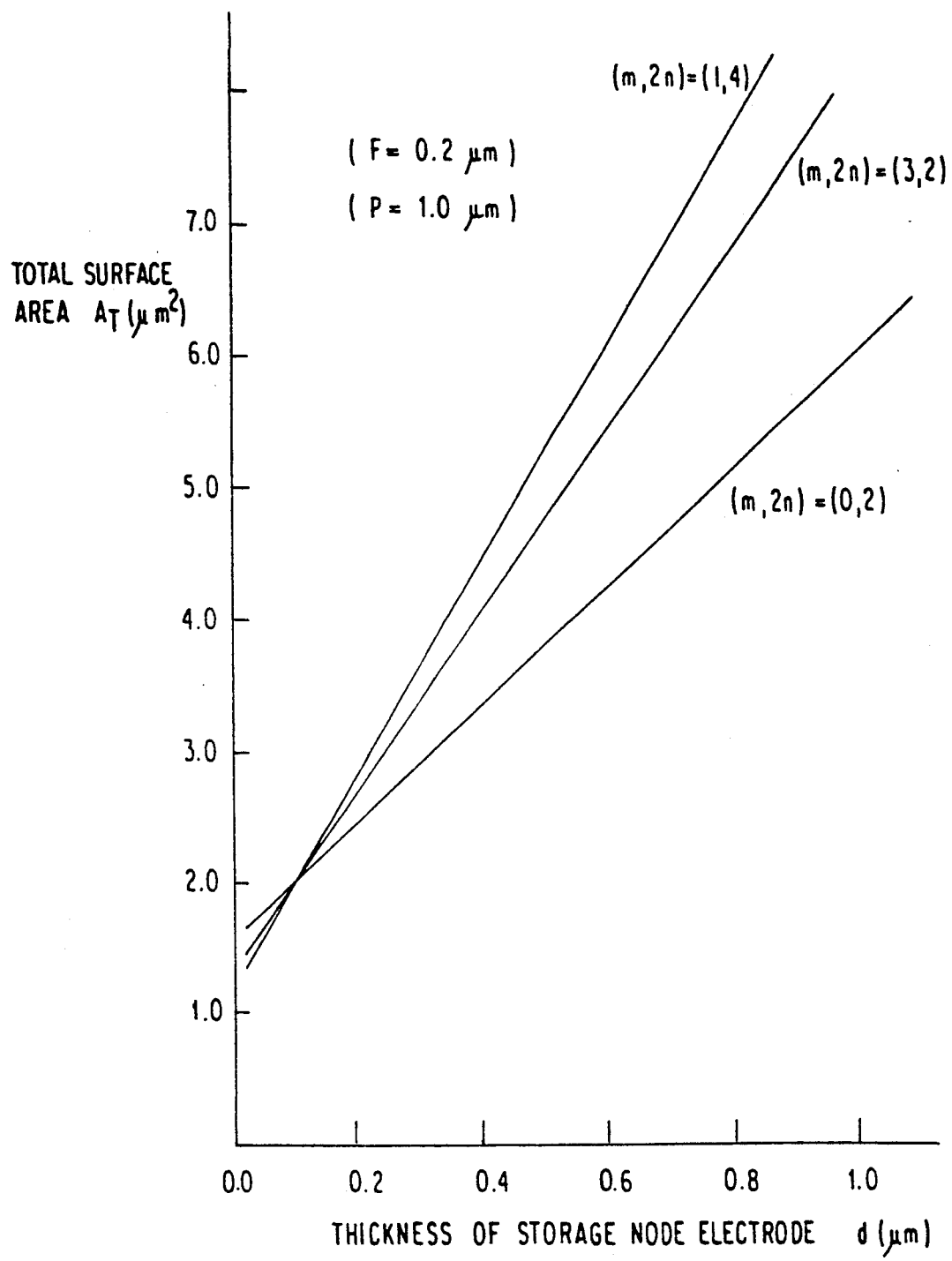
FIG. 3 is a graph showing the relationship between the film thickness and the surface area of the storage node electrode and serving for the description of the first construction of semiconductor memory device embodying the present invention.
Figure 4:
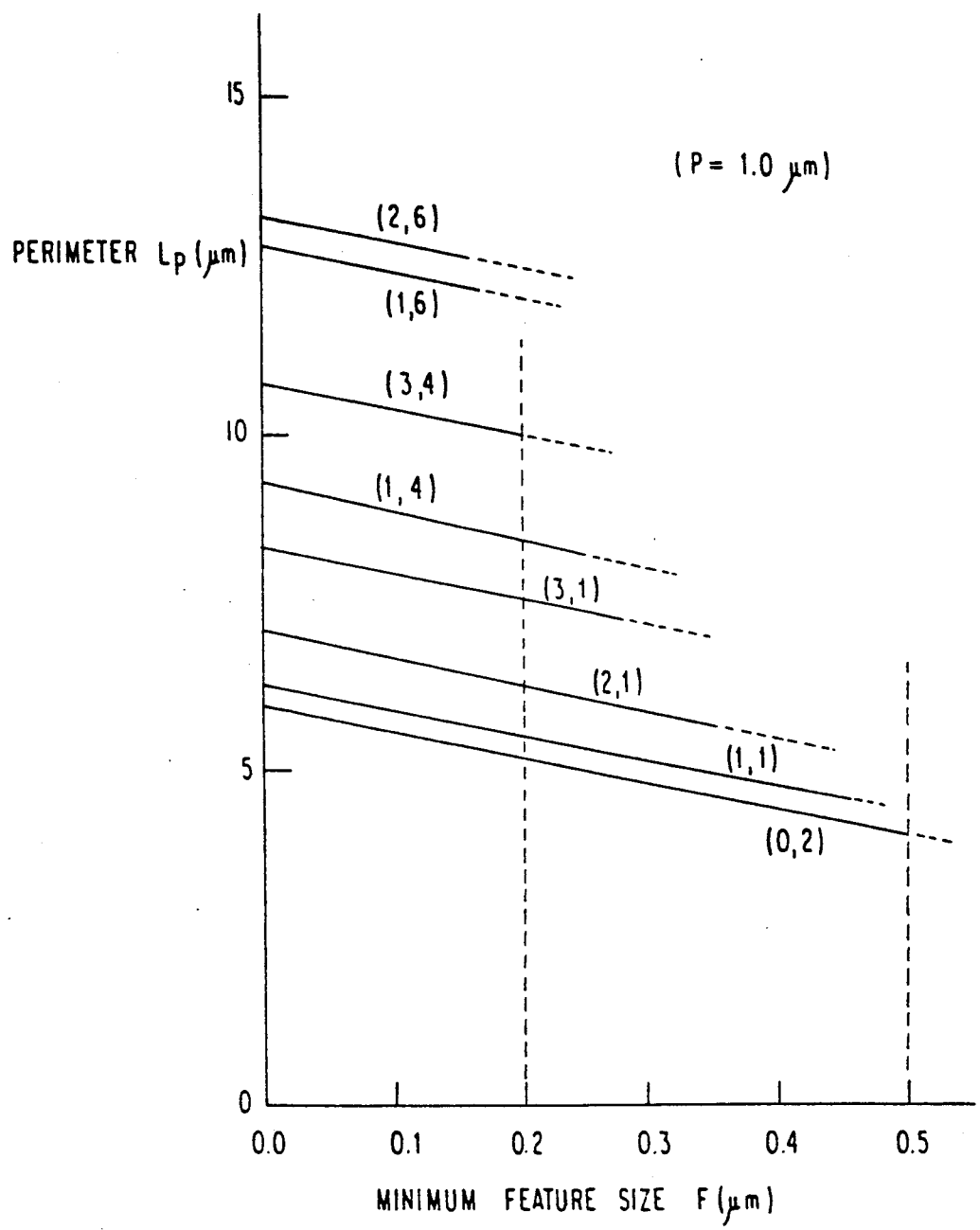
FIG. 4 is a graph showing the relationship between the minimum feature size and the perimeter of the storage node electrode and serving for the description of the first construction of semiconductor memory device embodying the present invention.

Referring to FIGS. 2 to 4, the first construction of semiconductor memory device according to the present invention will be set forth under the second assumption that the top face is substantially parallel to the surface of the silicon substrate. The reason for this is as follows: In the same way as in the prior art where even if the top face is formed of a curved surface, the top face in the present invention can be formed of a curved surface, too. Besides in memory cells of a recent DRAM, their surface area $A_{T0}$ depends much more on the side face area $A_{s0}$ than on the top face area $A_{t0}$.

From word and bit lines that are parallel to X-axis and Y-axis, respectively, and are arranged in pitch of 'P', as illustrated FIG. 2, a storage node contact hole forms a lattice point (m, 2n) using 'P' as unit. Assume that the major sides of the storage node electrode are disposed parallel to the direction of from lattice point (0, 0) to lattice point (m, 2n), wherein 'm' and 'n' are prime with respect to each other. Further let L and S be pitches of the major sides and the minor sides of the storage node electrodes, respectively, then $$LL = [(mP)^2 + (2nP)^2]^{\frac{1}{2}} \quad (1)$$

Using that the size of the cell is $2P^2$ gives $$S = 2P^2/L \quad (2)$$

The width (length of the minor side) of the storage node electrode and the distance between storage node electrodes are both limited to the minimum feature size, so that $$F \leq S/2 = P^2/[(mP)^2 + (2nP)^2]^{\frac{1}{2}} \quad (3)$$

Letting $L_p$ be the perimeter of the storage node electrode, $$\begin{aligned}L_p &= 2(L + S - 2F) \\ &= 2\{P(m^2 + 4n^2 + 2)/(m^2 + 4n^2)^{\frac{1}{2}}] - 2F\}\end{aligned} \quad (4)$$

Letting $A_T(m, 2n)$ be the surface area of the storage node electrode disposed parallel to the direction from lattice point (0, 0) to lattice (m, 2n), the surface area $A_{T0}$ of the conventional storage node electrode is expressed as $$\begin{aligned}A_{T0} &= A_T(0, 2) = A_{t0} + A_{s0} \\ &= (P - F)(S - F) + 2(3P - 2F)d\end{aligned} \quad (5)$$

$A_T(m, 2n)$ is expressed as $$A_T(m, 2n) = (L-F)(S-F) + 2(L+S-2F)d \quad (6)$$

If the condition:

$$A_{T0} = (0, 2) < A_T(m, 2n) \quad (7)$$

is met, the present invention is valid.

Substitution of $A_{T0}$ from equation (5) and $A_T$ from equation (6) gives $$d \geq F/2 \quad (8)$$

Now, for example, by using $P = 1.0$ μm and $F = 0.2$ μm, we obtain 5 lattice points meeting equation (3): (1, 2), (1, 4), (2, 2), (3, 2) and (3, 4) in addition to the above-mentioned (0, 2). FIG. 3 is a graph showing the dependence of the surface area $A_T(m, 2n)$ on the thickness d of the storage node electrode in comparison between the storage node electrodes shaped as rectangle having the direction defined by lattice points (1, 4) and (3, 2) according to the present invention and that (lattice point: 0, 2) in the prior art.

The permissible ranges of F with respect to P and the relationships F and $L_p$ are as follows:

Assuming that $(m, 2n) = (1, 2)$, $$F \leq P/5^{\frac{1}{2}}, L_p = 2[(7.5P/5^{\frac{1}{2}}) - 2F]$$

Assuming that $(m, 2n) = (2, 2)$, $$F \leq P/8^{\frac{1}{2}}, L_p = 2[(10P/8^{\frac{1}{2}}) - 2F]$$

Assuming that $(m, 2n) = (3, 2)$, $$F \leq P/13^{\frac{1}{2}}, L_p = 2[(15P/13^{\frac{1}{2}}) - 2F]$$

Assuming that $(m, 2n) = (1, 4)$, $$F \leq P/17^{\frac{1}{2}}, L_p = 2[(19P/17^{\frac{1}{2}}) - 2F]$$

with $(m, 2n) = (3, 2)$, $$F \leq P/5^{\frac{1}{2}}, L_p = 2[(27P/5) - 2F]$$

with $(m, 2n) = (1, 6)$, $$F \leq P/37^{\frac{1}{2}}, L_p = 2[(39P/37^{\frac{1}{2}}) - 2F]$$

with $(m, 2n) = (2, 6)$, $$F \leq P/40^{\frac{1}{2}}, L_p = 2[(42P/40^{\frac{1}{2}}) - 2F]$$

These results are collectively plotted as graph in FIG. 4 in which the wold lines indicate effective ranges.

P and F depends on each other. If F becomes smaller, P is required to correspondingly become smaller because of the desire for higher package of elements, contributing to the realization of smaller cell size. By experience, F varies between about 1/5 and about ¼ of P, and this leaves doubtful the realization with lattice points (1, 6) and (2, 6).

Figure 5A:
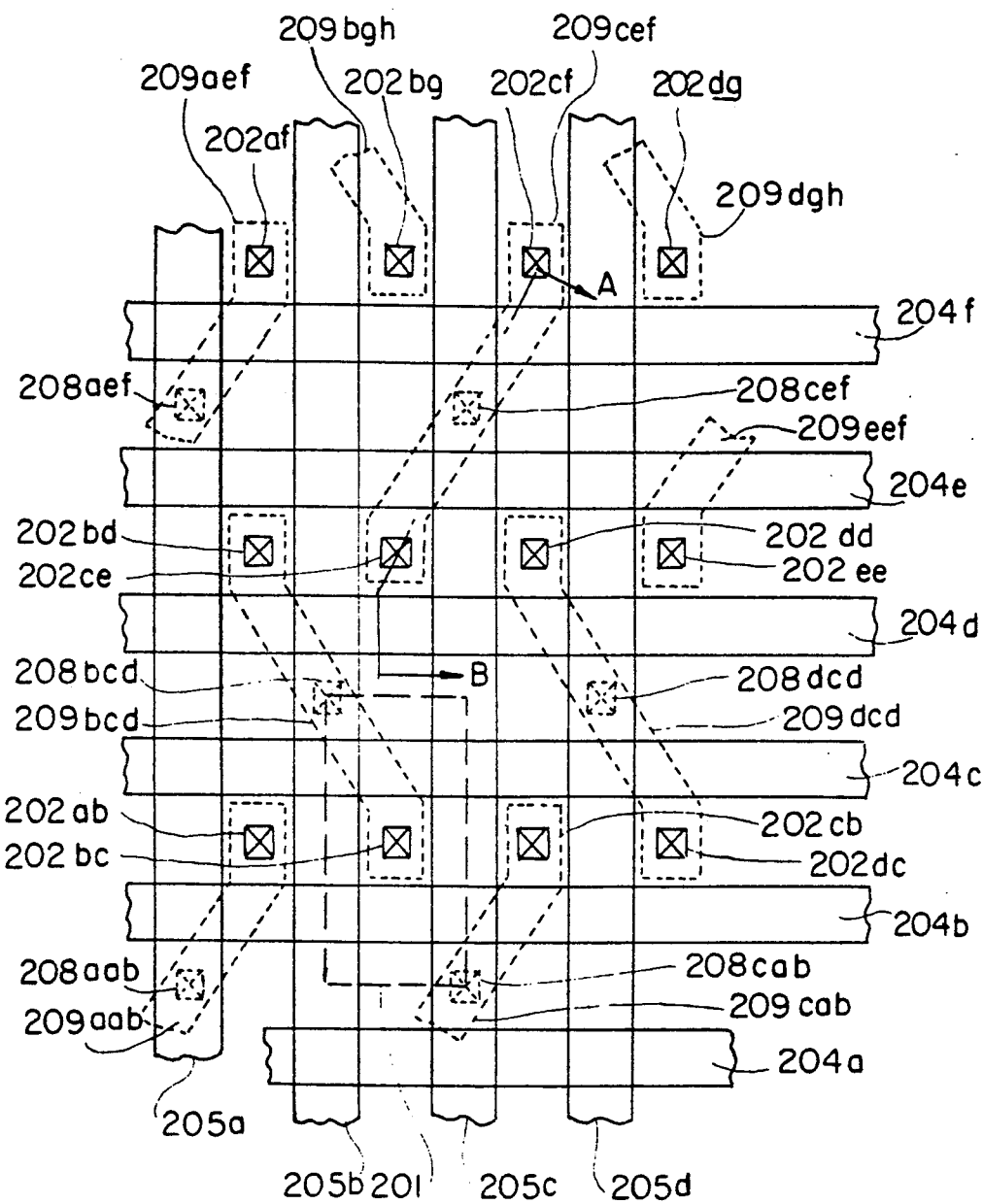
FIGS. 5A and 5B are plan views in schematic illustration of the first embodiment of the present invention.
Figure 5B:
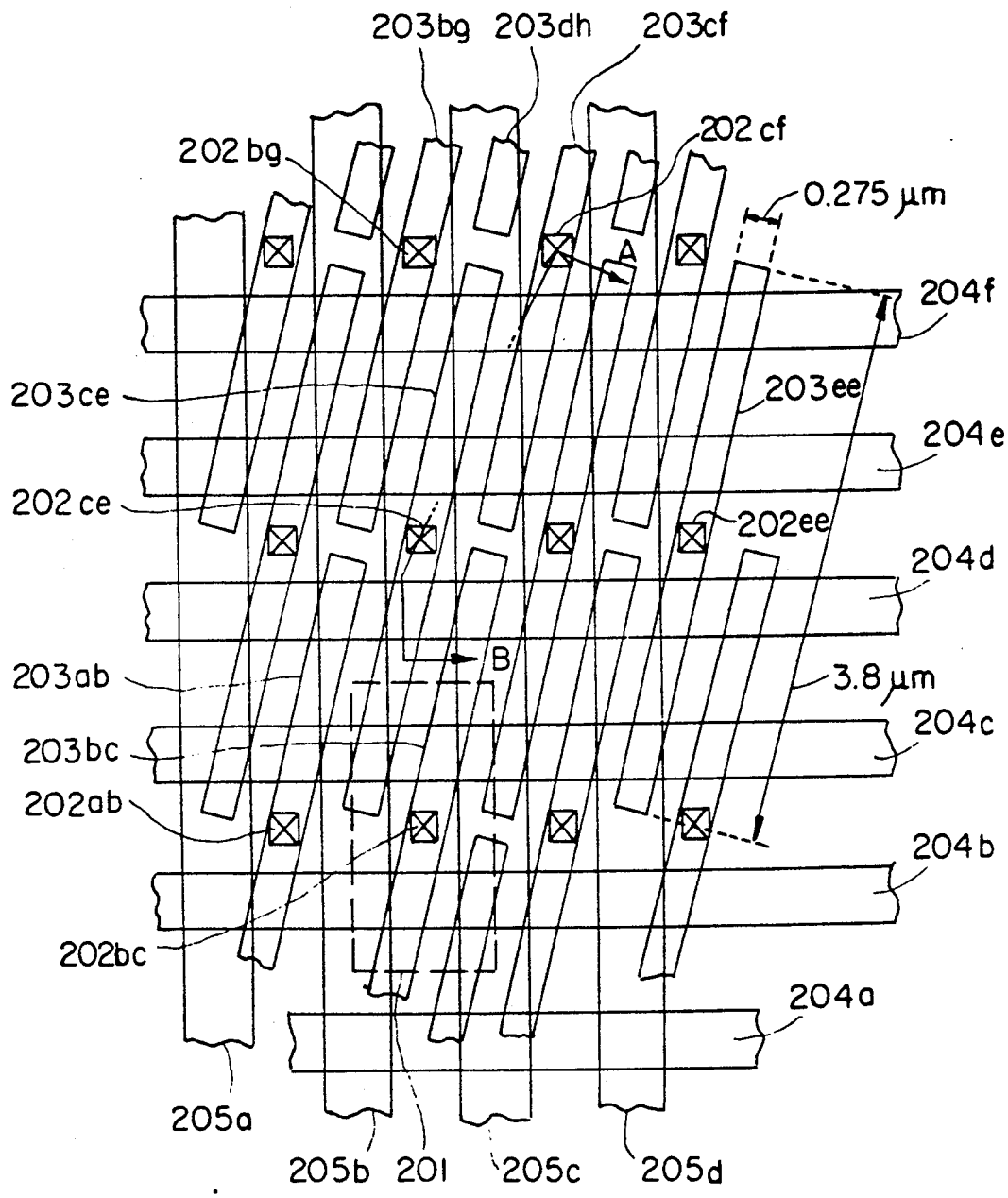
Figure 6A:
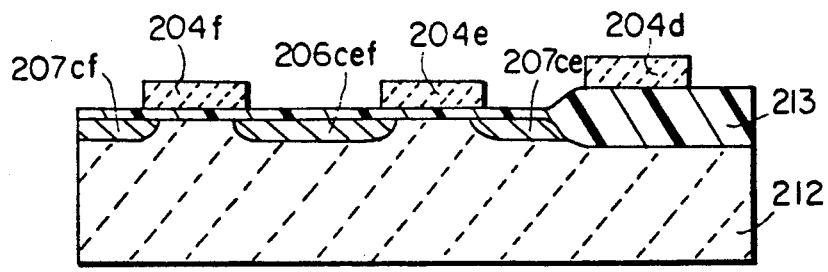
FIGS. 6A through 6E are cross-sectional views taken along folded line A-B of FIGS. 5A and 5B giving stepwise schematic illustration of a process for fabricating a semiconductor memory device involving the first embodiment according to the present invention.
Figure 6B:
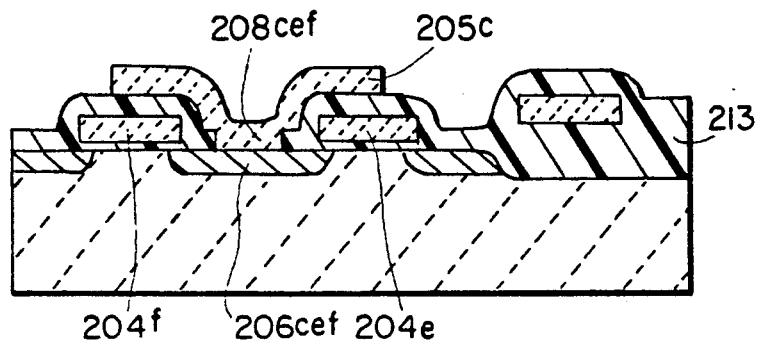
Figure 6C:
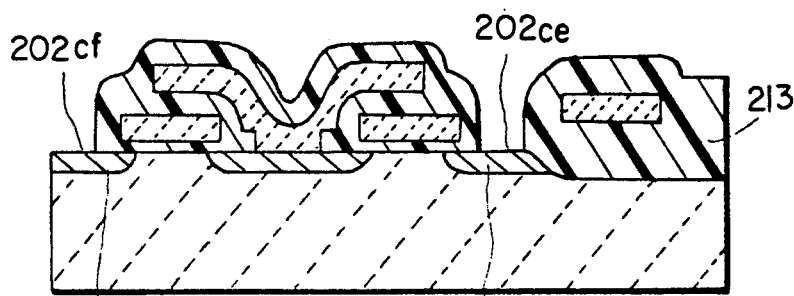
Figure 7A:
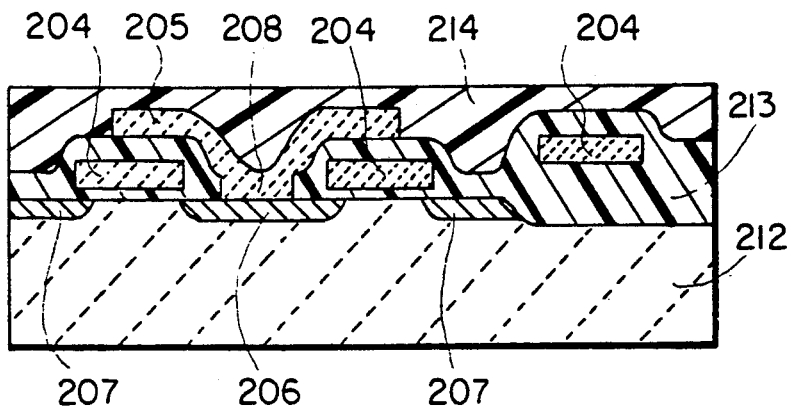
FIGS. 7A through 7C are cross-sectional views taken along folded line A-B of FIGS. 5A and 5B giving stepwise schematic illustration of an alternative process for fabricating a semiconductor memory device involving the first embodiment according to the present invention.
Figure 7B:
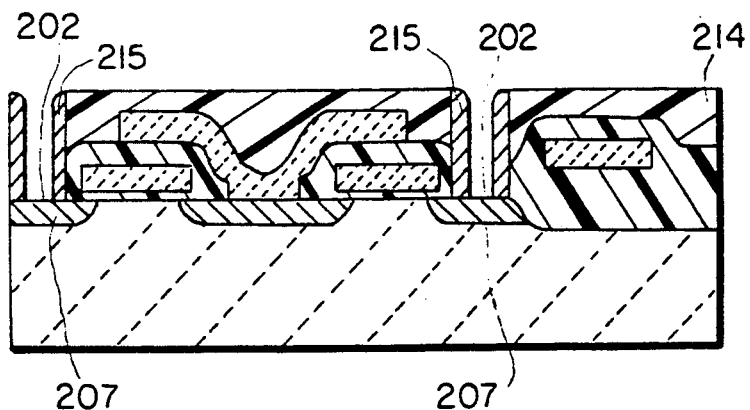
Figure 7C:
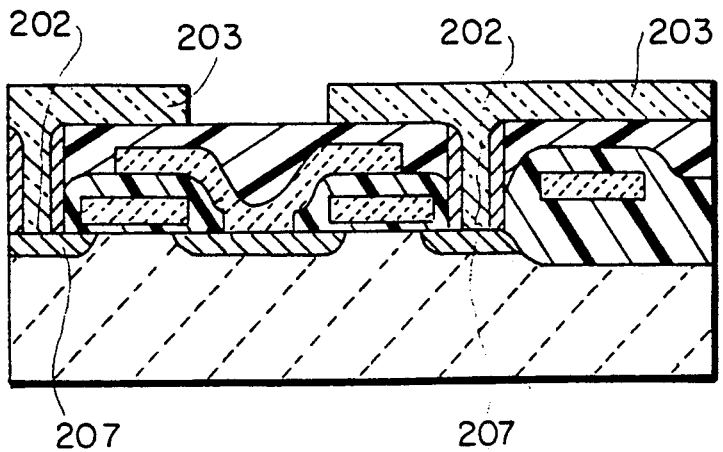

The first embodiment of the present invention will be described with reference to FIGS. 5A, 5B, 6A to 6C, and 7A to 7C below:

FIGS. 5A and 5B schematically illustrate this embodiment in plan view. FIGS. 6A to 6C schematically illustrate the sequential steps fabricating the DRAM involving this embodiment in sectional view taken along folded lines A-B of FIGS. 5A and 5B. FIGS. 7A to 7C schematically illustrate the sequential steps for fabricating an alternative semiconductor memory device involving this embodiment in sectional view taken along folded lines A-B of FIGS. 5A and 5B. Storage node electrodes in this embodiment are rectangular, and their major sides are arranged parallel to the line joining between lattice points (0, 0) and (1, 4).

Referring to FIGS. 5A and 5B, the construction of the DRAM of this embodiment will be set forth under: In FIG. 5A, the arrangement of word line 204, bit line 205, active area 209, storage node contact hole 202, and bit contact hole 208 is shown. In FIG. 5B, the arrangement of word line 204, bit line 205, storage node contact hole 202, and storage node electrode 203 is seen.

On the surface of a p-type silicon substrate, a matrix arrangement is formed which consists of word lines 204a, 204b, 204c, 204d, 204e, and 204f parallel to X-axis and bit lines 205a, 205b, 205c, 205d, 205e and 205f parallel to Y-axis orthogonal to X-axis. In the DRAM, the area one cell takes up is exhibited as by a memory cell 201 of which the cell size is the product of twice the pitch of word lines (the word line width plus the distance between word lines), P, and the pitch of bit lines (the bit line width plus the distance between bit lines), P, and thus 2P².

The p-type silicon substrate is provided on the surface thereof with active areas 209aab, 209aef, 209bcd, 209bgh, 209cab, 209cef, 209dcd, and 209dgh. For example, active area 209bcd is constructed of an area defined by word lines 204d, 2-4e and bit lines 205a, 205b, an area defined by word lines 204b, 204c and bit lines 205b, 205c, and the area interjoining these areas.

In active area 209, a n+-type diffusion region is provided in the remaining area except the just below word line 204. For example, in active area 209bcd, the n+-type diffusion regions between two adjacent word lines 204d, 204e and between two adjacent word lines 204b, 204c each serve as node diffusion regions. Besides there is provided a n+-type diffusion region just below bit line 205b serving as a bit diffusion region. This bit diffusion region, those node diffusion regions, and word lines 204c, 204d constitute a transistor for (b, c) bit and (b, d) bit.

On the surface of the bit diffusion region where active area 209 and bit line 205 intercross, there is provided a bit contact hole 208 for connecting to bit line 205. For example, there are provided bit contact holes 208cab, 208cef on bit diffusion regions where bit lines 205c and active areas 209cab and 209cef intercross. Similarly there the provided bit contact holes 208aab, 208aef, 208dcd, etc. in active areas 209aab, 209aef, 209dcd, etc.

On the surface of the node diffusion region in active area 209, there are provided a storage node contact hole 202 for connecting to storage node electrodes 203. For example, on the node diffusion region in active area 209bcd, there is provided a storage node contact hole 202bd between word lines 204d, 204e and a storage node contact hole 202bc between word lines 204b, 204c. Similarly there are provided storage node contact hole 202ab, etc. in active area 209aab, storage node contact hole 202cb, etc. in active area 209cab, storage node contact holes 202dc, 202dd in active area 209dcd, storage node contact holes 202ce, 202cf in active area 209cef, storage node contact holes 202af, etc. in active area 209aef, storage node contact holes 202bg, etc. in active area 209bgh, and storage node contact hole 202dg in active area 209dgf.

For example, storage node electrode 203ce connecting through storage node contact hole 202ce in the node diffusion region in active area 209cef to this node diffusion region serves as storage node electrode for (c, e) bit. Similarly there are provided storage node electrodes 203ab, 203bc, 203ee, 203bg, 203cf, etc. connecting through storage node contact holes 202ab, 202bc, 202ee, 202bg, 202cf, etc., to the respective node diffusion region.

Now, in this embodiment, if a DRAM is fabricated by assuming P=1.0 μm, F=P/5=0.2 μm, and d=0.5 μm, storage node electrodes 203 of 3.8 μm in major side and 0.275 μm in minor side are formed. From these, the following values are obtained: Let $A_{t1}$ be the area of the top face of the storage node electrode, $$A_{t1} = 3.8 \ \mu m \times 0.275 \ \mu m = 1.045 \ \mu m^2$$

Let $A_{s1}$ be the area of the side face, $$A_{s1} = 2 \times (3.8 \ \mu m + 0.275 \ \mu m) \times 0.5 \ \mu m^2 = 4.075 \ \mu m^2.$$

Therefore let $A_{T1}$ be the surface area of the storage node electrode, $$A_{T1} = A_{t1} + A_{s1} = 5.12 \ \mu m^2$$

On the other hand, if the DRAM illustrated in FIGS. 1A and 1B is fabricated under similar conditions, then the lengths of the major and minor sides are found to be 1.8 μm and 0.8 μm, respectively, and similarly the values the various areas about the storage node electrode 103 (See FIG. 1A) are given as:

$$A_{t0} = 1.8 \ \mu m \times 0.8 \ \mu m = 1.44 \ \mu m^2$$

$$A_{s0} = 2 \times (1.8 \ \mu m + 0.8 \ \mu m) \times 0.5 \ \mu l \ m^2 = 2.6 \ \mu m^2.$$

From these, the surface area of the storage node electrode 103, $$A_{T0} = A_{t0} + A_{s0} = 4.04 \ \mu m^2$$

As apparent from the above-state, this embodiment gives a storage node electrode 203 about 25% large in surface area compared with the prior art.

In the following, referring to FIGS. 6A to 6E, the first process of fabricating the DRAM involving this embodiment. FIGS. 6A to 6E schematically illustrates the sequential processing steps in sectional view taken along folded line A-B of FIGS. 5A and 5B. Because of playing no essential parts for the description of this embodiment, gate insulating film, field oxide film, and interlayer insulating film are referred to collectively as insulating film designated with 213.

As FIG. 6A shows, on the surface of a p-type silicon substrate 212 are formed an active area 209cef (See FIG. 5A) and insulating film 213 thin above the active area and thick in the remaining area. Then, word lines 204d, 204e, 204f, 0.8 μm, wide, as of n+-type polycrystalline silicon film are formed. Besides three n+-type self-aligned diffusion regions with word lines 204d, 204e are formed in active area 209cef by ion implantation of n-type impurity. The central n+-type diffusion region between word lines 204e, 204f serves as bit diffusion region 206cef, and two n+-type diffusion regions at the ends serve as node diffusion regions 207ce, 207cf. Word line 204e, bit diffusion region 206cef, and node diffusion region 207ce constitute a transistor for bit (c, e). Similarly word line 204f, bit diffusion region 206cef, and node diffusion region 207cf constitute a transistor for bit (c, f).

In the next step, as shown in FIG. 6B, after word lines 204d, 204e, 204f, etc. are covered with insulating film 213, the portion of insulating film 213 on the surface of bit diffusion region 206cef is etched away to open a bit contact hole 208cef. Then bit lines 205, etc., about 1 μm wide, of tungsten silicide film are formed. Bit line 205c connecting through bit contact hole 208cef to bit diffusion region 206cef.

In the next step, as shown in FIG. 6C, bit lines 205c, etc. are covered with insulating film 213, and then the portions of insulating film 213 on the surfaces of node diffusion regions 207ce, 207cf are etched away to open storage node contact holes 202ce, 202cf.

Figure 6D:
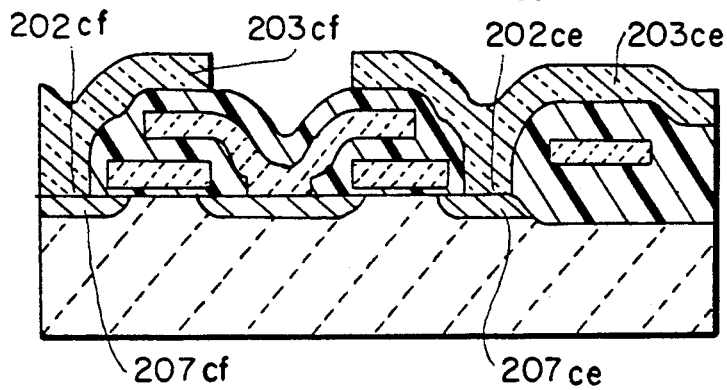

In the next step, as shown in FIG. 6D, polycrystalline silicon film is deposited to a thickness of 0.5 μm over the entire surface, followed by ion implantation of phosphorus, and then patterning to form storage node electrodes 203ce, 203cf, etc. These storage node electrodes 203ce, 203cf serve as storage node electrodes for (c, e) bit, (c, f) bit.

Figure 6E:
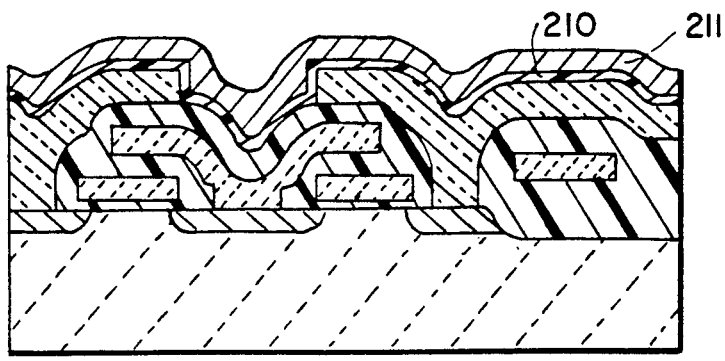

In the next step, as shown in FIG. 6E, a capacitive dielectric film 210, followed by cell plate electrode 211, are formed. Thus storage node electrode 203ce, capacitive dielectric film 210, and cell plate electrode 211 constitute a stacked-type capacitor for (c, e) bit. Similarly storage node electrode 203cf, capacitive dielectric film 210 and cell plate 211 constitute a stacked-type capacitor for (f, e) bit. Thus the basic structure of the DRAM of this embodiment becomes completed. Subsequent processing steps are the same way as in fabricating the conventional DRAM.

In the following, referring to FIGS. 7A to 7E, the second process of fabricating the DRAM involving this embodiment. FIGS. 7A to 7C schematically illustrates the sequential processing steps in sectional view taken along folded line A-B in FIGS. 5A and 5B. This process proceeds to the step of FIG. 6B in the same as in the first fabricating process described above.

On the surface of a p-type silicon substrate 212 are formed active areas and insulating film 213. Then word lines 204, bit regions 206, and node diffusion regions 207 are formed. Besides, on the surface of bit diffusion regions 206 are opened bit contact holes 208. Bit lines 205 connecting through these holes to bit diffusion regions 206 is formed. Then as shown in FIG. 7A, BPSG film is deposited to a thickness of about 1.5 μm over the entire surface, and subjected to thermal treatment in nitrogen atmosphere to form reflowed BPSG film 214.

In the next step, as shown in FIG. 7B, the portions of BPSG film 214 and insulating film 213 above surfaces of node diffusion regions 207 are etched away in sequence to make storage node contact holes 202. Then silicon oxide film is deposited to a thickness of 0.1 μm over the entire surface, and etched back by anisotropic etching technique to form spacers 215 of silicon oxide film on the inside surfaces of storage node contact holes 202.

In the next step, as shown in FIG. 7C, polycrystalline silicon film is deposited to a thickness of 0.5 μm over the entire surface, followed by ion implantation of phosphorus, and then a storage node electrode 203 is formed by lithography and etching in the usual way. Subsequently, the process proceeds in the same way as in the first fabricating process.

Advantage of the second manufacturing process over the first fabricating process above-stated resides in that after complete planarization, thereby storage node electrodes can be formed by easy patterning. In the first process, patterning of storage node electrodes is performed especially to obliquely cross the irregular surface of bit lines, and thus it cannot be allowed to neglect influence of multiple reflection on lithography.

Figure 8B:
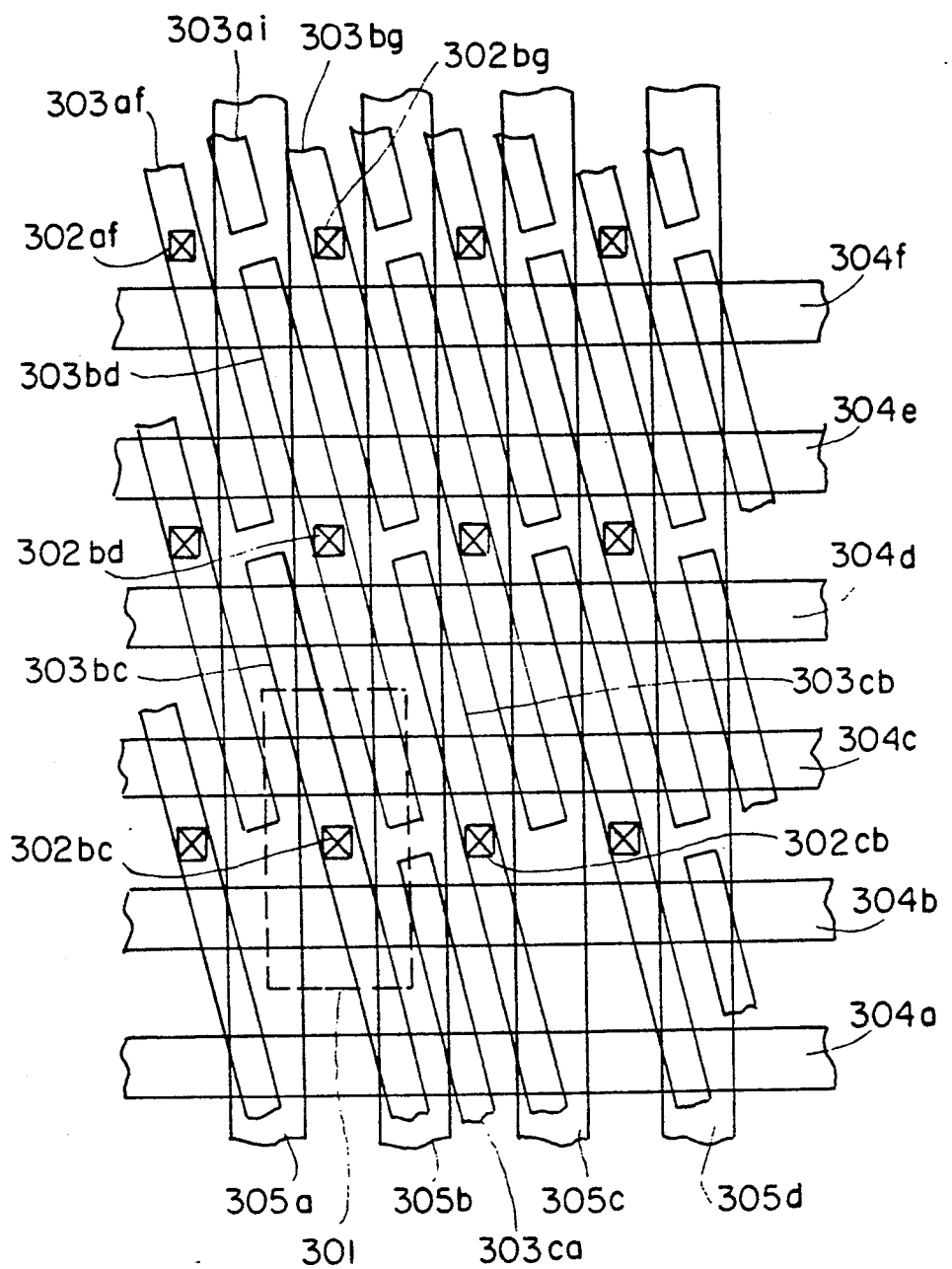

Referring to FIGS. 8A and 8B will be set forth the second embodiment of the present invention which is distinguished from the first embodiment in the respect of the pattern of active areas. In this embodiment, storage node electrodes are rectangular and their major sides are arranged parallel to the line interjoining lattice points (0, 0), (−1, 4) as represented in the description of FIGS. 2 to 4.

In FIG. 8A, the arrangement of word lines 304, bit lines 305, active areas 309, storage node contact holes 302, and bit contact holes 308 is shown. In FIG. 8B, the arrangement of word lines 304, bit lines 305, storage node contact holes 302, and storage node electrodes 303 is seen.

On the surface of a p-type silicon substrate, a matrix arrangement is formed which consists of word lines 304a, 304b, 304c, 304d, 304e, and 304f parallel to X-axis and bit lines 305a, 305b, 305c, 305d, 305e and 305f parallel to Y-axis orthogonal to X-axis. In the DRAM, the area one memory cell takes up is exhibited as by a memory cell 301 of which the cell size is the product of twice the pitch of word lines (the word lines width plus the distance between word lines), P (=1.0 μm), and the pitch of bit lines (the bit line width plus the distance between bit lines), P (=1.0 μm), and thus 2.0 μm².

The p-type silicon substrate is provided on the surface thereof with active areas 309aab, 309aef, 309bcd, 309bgh, 309cab, 309cef, 309dcd, and 309dgh, etc. For example, active area 309bcd is constructed of an area defined by word lines 304a, 304e and bit lines 305a, 305b, an area defined between word lines 304b and 304c, and just below bit line 305b.

A n+-type diffusion region is provided in the remaining area in active area 309 except the just below word line 304. For example, in active area 309bcd, the n+-type diffusion regions between two adjacent word lines 304d, 304e and between two adjacent word lines 304b, 304c each serve as a node diffusion region. Besides there is provided a n+-type diffusion region just below bit line 305b serving as a bit diffusion region. Thus bit diffusion region, those node diffusion regions and word lines 304c, 304d constitute transistors for (b, c) bit and (b, d) bit.

On the surface of bit diffusion regions where active areas 309 and bit lines 305 intercross, there are provided bit contact holes 308 for connecting to bit lines 305. For example, there are provided bit contact holes 308cab, 308cef on bit diffusion regions where bit line 305c and active areas 309cab and 309cef intercross. Similarly there are provided bit contact holes 308aab, 308aef, 308dcd, etc. in active areas 309aab, 309aef, 309dcd, etc.

On the surface of the node diffusion region in active area 309, there are provided a storage node contact hole 302 for connecting to storage node electrodes 303. For example, on the node diffusion region in active area 309bcd, there is provided a storage node contact hole 302bd between word lines 304d, 304e and a storage node contact hole 302bc between word lines 304b, 304c. Similarly there are provided storage node contact hole 302ab, etc. in active area 309aab, storage node contact hole 302cb, etc. in active area 309cab, storage node contact holes 302dc, 302dd in active area 309dcd, storage node contact holes 302ce, 302cf in active area 309cef, storage node contact holes 302ae, 302af, etc. in active area 309aef, storage node contact holes 302bg, etc. in active area 309bgh, and storage node contact hole 302dg in active area 309dgf.

For example, storage node electrode 303bd connecting through storage node contact hole 302bd in the node diffusion region in active area 309bcd to this node diffusion region serves as storage node electrode for (b, d) bit. Similarly there are provided storage node electrodes 303bc, 303cb, 303af, 303bg, etc. connecting through storage node contact holes 302bc, 302cb, 302af, 302bg, etc., to the respective node diffusion regions.

The surface area of the storage node electrode in this embodiment, $A_{T2}$ is the same as that in the first embodiment, and hence similar in effect. In other words, the change in the pattern of the active area causes no change in the surface area of the storage node electrode.

Referring to FIG. 9 will be set forth the third embodiment of the present invention in which storage node electrodes are rectangular and their major sides air arranged parallel to the line interjoining lattice points (0, 0) and (3, 2) as represented in the description of FIGS. 2 to 4.

On the surface of a p-type silicon substrate, a matrix arrangement is formed which consists of word lines 404a, 404b, 404c, 404d, and 404e parallel to X-axis and bit lines 405a, 405b, 405c, 405d, 405e and 405f parallel to Y-axid orthogonal to X-axis. In the DRAM, the area one memory cell takes up is exhibited as by a memory cell 401 of which the cell size is the product of twice the pitch of word lines (the word line width plus the distance between word lines), P (=1.0 μm), and the pitch of bit lines (the bit line width plus the distance between bit lines), P (=1.0 μm), and thus 2.0 μm².

The pattern of the active area (not shown) in this embodiment is the same as in the first or second embodiment. For example, on the surface of the active area (node diffusion region) defined between word lines 404b, 404c and by two adjacent bit lines, there is provided a storage node contact hole 402. Storage node electrode 403 connects through storage node contact hole 402 to the node diffusion region.

Storage node electrode 403 in this embodiment is 3.4 μm in major side length and 0.35 μm in minor side length, and thus the following values are obtained:

Letting $A_{t3}$ be the area of the top face of the storage node electrode 403, $$A_{t3}=3.4\ \mu m \times 0.35\ \mu m=1.19\ \mu m^2$$

Letting $A_{s3}$ be the area of the side face, $$A_{s3}=2\times(3.4\ \mu m+0.35\ \mu m)\times 0.5\ \mu m^2=3.75\ \mu m^2.$$

From these, and letting $A_{T3}$ be the surface area of the storage node electrode, $$A_{T3}=A_{t3}+A_{s3}=4.94\ \mu m$$

As apparent from the above-stated, this embodiment gives the storage node electrode 403 about 22% large in surface area compared with the prior art.

Figure 10:
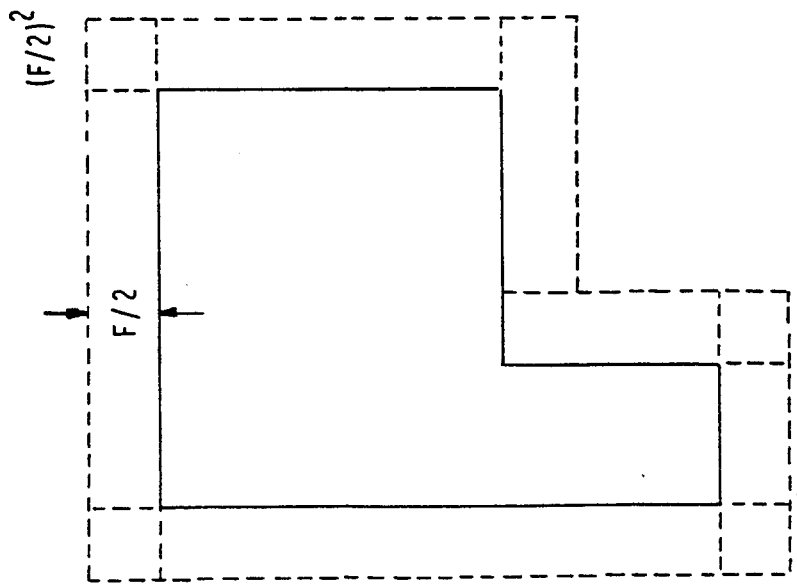
FIG. 10 illustrates the second construction according to the present invention.

Referring to FIG. 10, the construction of the second embodiment of semiconductor memory device will be set forth below: Storage node electrodes are arranged to be highly-packed at interval of minimum feature size F in a memory cell array. Letting $A_c$ be the size of the memory cell, then the top face of the storage node electrode, whatever its shape may be, including the distance between the adjacent storage node electrodes becomes equal to $A_c$. In the case where, in the same way as in the second embodiment of the present invention, the storage node electrode has a pattern composed of at least two different rectangles, and letting $L_p$ be the perimeter of the storage node electrode, then the pattern is constructed of four squares each having an area of $(F/2)^2$ and six rectangles having minor sides of F/2. The summation of the major sides of the six rectangles gives $L_p$. The area of the pattern therefore is expressed as $$L_p\times F/2+4\times(F/2)^2=L_p\times F/2+F^2 \quad (9)$$

Accordingly the top of the storage node electrode is expressed by $$A_c-L_p\times F/2-F^2 \quad (10)$$

Using the thickness (height) d of the storage node electrode, gives the surface area of the storage node electrode, $A_T$, as $$A_T=A_c-L_p\times F/2-F^2+L_p\times d \quad (11).$$

Assuming a storage node electrode having the usual shape, the possible largest surface area, $A_{T0}$, and the perimeter, $L_{P0}$, under this condition are given as $$A_{T0}=A_c-L_{P0}\times F/2-F^2+L_{P0}\times d \quad (12).$$

For meeting the condition under which the surface area of the storage node electrode having the shape consisting of two different rectangles, $A_T$, is more $A_{T0}$, it follows that $$A_T-A_{T0}=(L_P-L_{P0})(d-F/2)\geq 0 \quad (13)$$

Hence $L_p\geq L_{P0}$, $d\geq F/2$. Thus if d is more than F/2, $L_p$ should be longer than $L_{P0}$. This result is the same as that of the first embodiment of the present invention.

Figure 11:
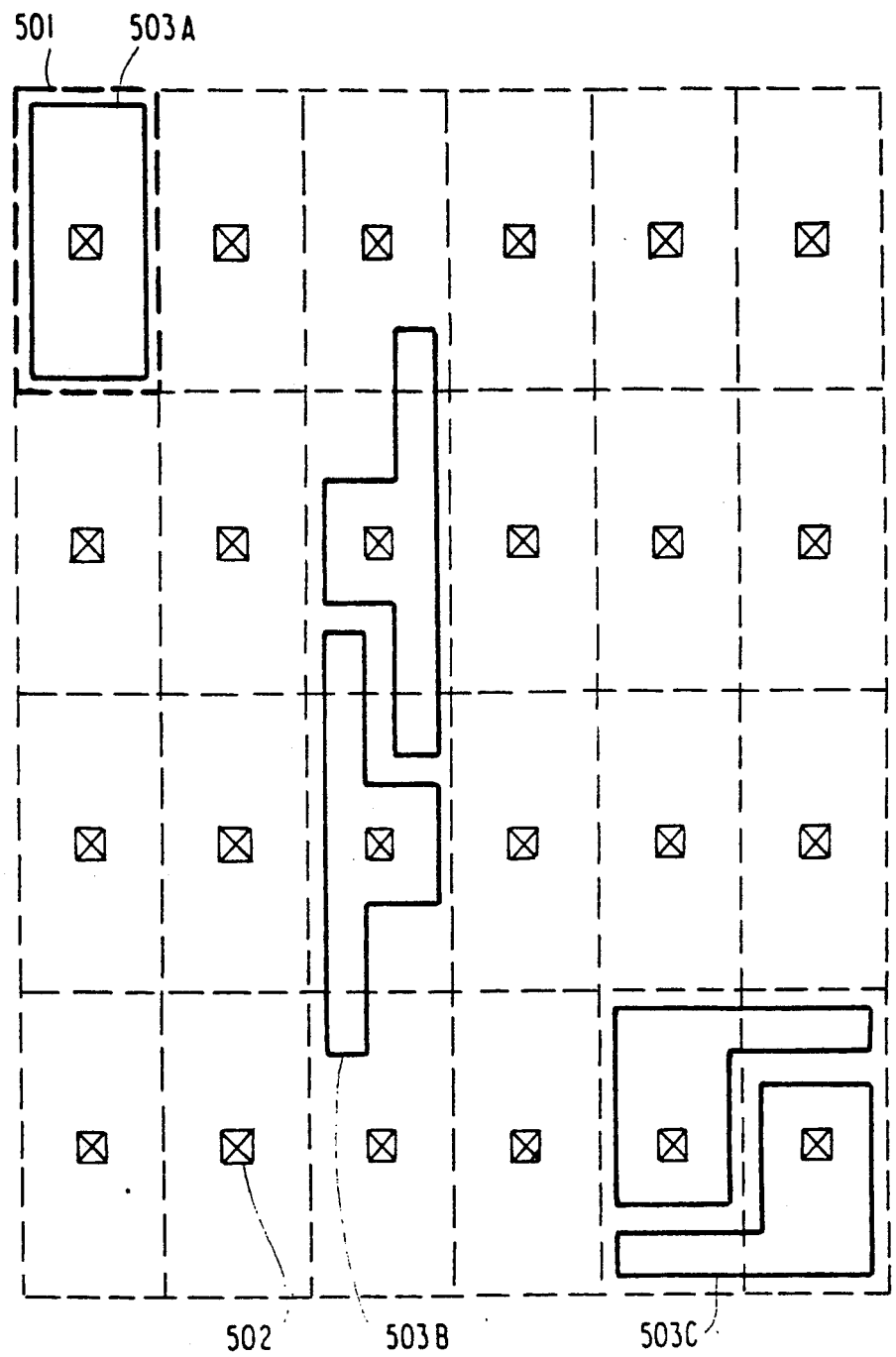
FIG. 11 illustrates the pattern of the storage node electrode according to the fourth embodiment of the present invention.

In the following, the fourth embodiment based on the second construction will be set forth with reference to FIG. 11 in which memory cells 501 are arranged at a pitch of 'P' in column parallel to word lines and at a pitch of 2P in rows parallel to bit lines. There is provided a storage node contact hole at the center of each memory cell 501.

Combination of at least two deferent rectangles produces, for example, L-, T-, S-, m-shape, etc., and these are considered basically to be L-shape. A typical example of storage node electrode extending to the adjacent memory cells in row is designated at reference character 503B which may extend in row over two or three memory cells. Reference character 503C designates a typical example of storage node electrode extending in column similarly over the adjacent two or three memory cells. A storage node electrode in the prior art having the shape of which the surface area is maximal is designated at 503A.

With regard to two types, permissible ranges of F with respect to P, and the relationships between F and $L_P$ are given below:

For the type of storage node electrode 503F longer in row, $$F\leq P/4, L_P=2\times(5P-4F).$$

For the type of storage node electrode 503C longer in row, $$F\leq P/3, L_P=8\times(P-F).$$

Figure 12:
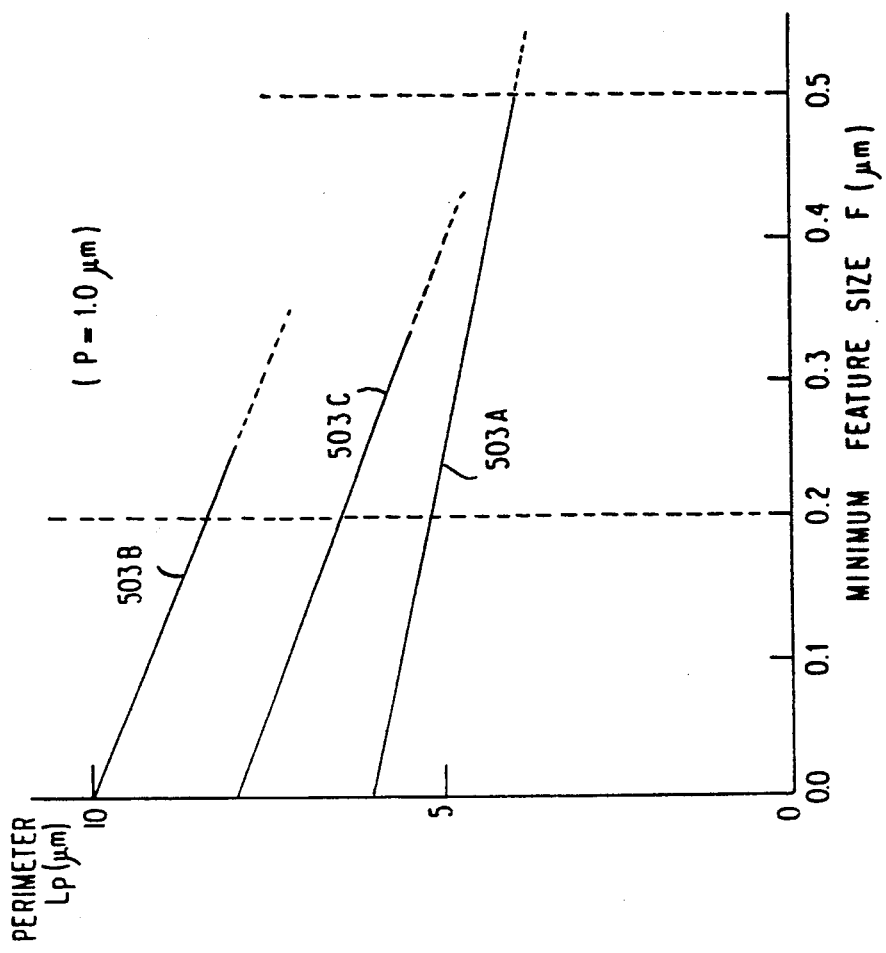
FIG. 12 is a graph showing the relationship between minimum feature size and the perimeter of the storage node electrode and serving for the description of the fourth embodiment.

These relationships are collectively plotted as the graph in FIG. 12 in which the sold lines indicate effective ranges.

Although the invention has been described with reference to specific embodiments, this description is not meant to be construed in a limiting sense. Various modifications of the disclosed embodiment, as well as other embodiments of the invention, will becomes apparent to persons skilled in the art upon reference to the description of the invention. It is therefore contemplated that the appended claims will cover any modifications or embodiments as fall within the scope of the invention.

I claim:

1. In a DRAM having memory cells each including a transistor and stacked-type charge-storage capacitor formed on the surface of a silicon substrate, word lines parallel to an X-axis and bit lines parallel to a Y-axis orthogonal to the X-axis, a semiconductor memory device comprising a storage node electrode of said charge-storage capacitor having a thickness more than ½ of a minimum feature size, said storage node electrode projecting a rectangle on the surface of said silicon substrate, and the major sides of said rectangle being oblique to said X-axis and said Y-axis and further to said transistor so that said rectangle is extended over an adjacent memory cell.

2. A semiconductor memory device as claimed in claim 1, wherein the distance between adjacent storage node electrodes is said minimum feature size.

3. A semiconductor memory device as claimed in claim 1, wherein the pitch of said word lines is equal to the pitch of said bit lines.

4. A semiconductor memory device as claimed in claim 2, wherein the pitch of said word lines is equal to the pitch of said bit lines.

5. A semiconductor memory device as claimed in claim 2, wherein said major sides of said rectangle are parallel to one of the diagonals of the rectangle constructed of i-th and (i+1)th bit lines and j-th and (j+2)th word lines.

6. A semiconductor memory device as claimed in claim 2, wherein said major sides of said rectangle are parallel to one of the diagonals of the rectangle formed of i-th and (i+1)th bit lines and j-th and (j+4)th word lines.

7. A semiconductor memory device as claimed in claim 2, wherein said major sides of said rectangle are parallel to one of the diagonals of the rectangle formed of the i-th and (i+2)th bit lines and j-th and (j+2)th word lines.

8. A semiconductor memory device as claimed in claim 2, wherein said major sides of said rectangle are parallel to one of the diagonals of the rectangle formed of i-th and (i+3)th bit lines and j-th and (j+2)th word lines.

9. A semiconductor memory device as claimed in claim 2, wherein said major sides of said rectangle are parallel to one of the diagonals of the rectangle formed of j-th and (i+3)th bit lines and j-th and (j+4)th word lines.

10. A semiconductor memory device as claimed in claim 4, wherein said major sides of said rectangle are parallel to one of the diagonals of the rectangle formed of i-th and (i+1)th bit lines and j-th and (j+2)th word lines.

11. A semiconductor memory device as claimed in claim 4, wherein said major sides of said rectangle are parallel to one of the diagonals of the rectangle formed of i-th and (i+1)th bit lines and j-th and (j+4)th word lines.

12. A semiconductor memory device as claimed in claim 4, wherein said major sides of said rectangle are parallel to one of the diagonals of the rectangle formed of i-th and (i+2)th bit lines and j-th and (j+2)th word lines.

13. A semiconductor memory device as claimed in claim 4, wherein said major sides of said rectangle are parallel to one of the diagonals of the rectangle formed of i-th and (i+3)th bit lines and j-th and (j+2)th word lines.

14. A semiconductor memory device as claimed in claim 4, wherein said major sides of said rectangle are parallel to one of the diagonals of the rectangle formed of i-th and (i+3)th bit lines and j-th and (j+4)th word lines.

15. In a DRAM having memory cells each including a transistor and stacked-type charge-storage capacitor formed on the surface of a silicon substrate, word lines parallel to an X-axis and bit lines parallel to a Y-axis orthogonal to the X-axis, a semiconductor memory device comprising a storage node electrode of said charge-storage capacitor having a thickness more than ½ of a minimum feature size, said node electrode projecting a pattern formed of at least two rectangles having sides parallel to the X-axis or the Y-axis and extended over an adjacent memory cell.

16. A semiconductor memory device as claimed in claim 15, wherein the distance between adjacent storage node electrodes is said minimum feature size.

17. A semiconductor memory device as claimed in claim 15, wherein the pitch of said word lines is equal to the pitch of said bit lines.

18. A semiconductor memory device as claimed in claim 16, wherein the pitch of said word lines is equal to the pitch of said bit lines.

19. A semiconductor memory device comprising word lines, bit lines, and memory cells each having a stacked-type capacitor and a transistor, said capacitor having a storage node electrode,
said transistor being connected with one of said bit lines via a bit line contact hole and with said storage node electrode via a storage node contact hole, and said storage node electrode being slender and oblique to said word lines and said bit lines and further to a direction defined by said storage node contact hole and said bit line contact hole.

20. A semiconductor memory device as claimed in claim 19, wherein said storage node electrode is formed in the shape of a rectangle and extends to at least one of the other memory cells, and major sides of said rectangle and parallel to a diagonal of the rectangle constructed of two bit lines and two word lines.

* * * * *

UNITED STATES PATENT AND TRADEMARK OFFICE
CERTIFICATE OF CORRECTION

PATENT NO. : 5,298,775
DATED : March 29, 1994
INVENTOR(S) : Shuichi Ohya

It is certified that error appears in the above-identified patent and that said Letters Patent is hereby corrected as shown below:

Col. 1, line 66, delete "2the" and insert --2th--.

Col. 2, line 64, delete "wores" and insert --words--.

Col. 6, line 35, delete "wrod" and insert --word--.

Col. 8, line 47, delete "wold" and insert --word--.

Col. 9, line 25, delete "2-4e" and insert --204e--.

Col. 10, line 31, delete "$\mu l\ m^2$" and insert --$\mu m^2$--

Col. 13, line 16, delete "air" and insert --are--;

Col. 13, line 24, delete "axid" and insert --axis--.

Col. 14, line 44, delete "deferent" and insert --different--;

Col. 14, line 59, delete "F" and insert --B--.

Col. 15, line 2, delete "sold" and insert --solid--.

Signed and Sealed this

Twentieth Day of September, 1994

*Attest:*

BRUCE LEHMAN

*Attesting Officer*  *Commissioner of Patents and Trademarks*